(12) United States Patent
Jin et al.

(10) Patent No.: US 7,060,575 B2
(45) Date of Patent: Jun. 13, 2006

(54) SEMICONDUCTOR DEVICE HAVING TRANSISTOR AND METHOD OF MANUFACTURING THE SAME

(75) Inventors: Beom-jun Jin, Seoul (KR); Byeong-yun Nam, Kyungki-do (KR); Young-pil Kim, Kyungki-do (KR)

(73) Assignee: Samsung Electronics Co., Ltd. (KR)

( * ) Notice: Subject to any disclaimer, the term of this patent is extended or adjusted under 35 U.S.C. 154(b) by 97 days.

(21) Appl. No.: 10/426,585

(22) Filed: Apr. 30, 2003

(65) Prior Publication Data
US 2003/0197229 A1    Oct. 23, 2003

Related U.S. Application Data

(62) Division of application No. 09/992,069, filed on Nov. 14, 2001.

(30) Foreign Application Priority Data
May 24, 2001    (KR) ................................. 2001-28692

(51) Int. Cl.
*H01L 21/336*    (2006.01)

(52) U.S. Cl. ..................... 438/300; 257/388; 257/389; 257/390

(58) Field of Classification Search ................ 438/299, 438/128–130, 275, 278, 300; 257/288, 406–412, 257/413, 314–315, 370–371, 388, 389, 340
See application file for complete search history.

(56) References Cited

U.S. PATENT DOCUMENTS

| 5,863,820 | A | * | 1/1999 | Huang ........................ 438/241 |
|---|---|---|---|---|
| 6,049,114 | A | | 4/2000 | Maiti et al. .................. 257/412 |
| 6,075,274 | A | | 6/2000 | Wu et al. ..................... 257/413 |
| 6,165,883 | A | | 12/2000 | Hiura ........................... 438/592 |
| 6,168,984 | B1 | * | 1/2001 | Yoo et al. .................... 438/239 |
| 6,242,300 | B1 | * | 6/2001 | Wang ........................... 438/241 |
| 6,365,955 | B1 | | 4/2002 | Lee et al. ..................... 257/534 |
| 6,429,067 | B1 | * | 8/2002 | Liu et al. ...................... 438/241 |
| 6,642,585 | B1 | * | 11/2003 | Ohuchi et al. .............. 257/388 |
| 6,674,132 | B1 | * | 1/2004 | Willer .......................... 257/390 |
| 6,690,050 | B1 | * | 2/2004 | Taniguchi et al. .......... 257/296 |
| 2001/0052611 | A1 | * | 12/2001 | Kim ............................. 257/296 |
| 2003/0132479 | A1 | * | 7/2003 | Nakamura et al. .......... 257/315 |
| 2004/0108527 | A1 | * | 6/2004 | Taniguchi et al. .......... 257/213 |

\* cited by examiner

*Primary Examiner*—Hoai Pham
*Assistant Examiner*—Nathan W. Ha
(74) *Attorney, Agent, or Firm*—Myers Bigel Sibley & Sajovec

(57) ABSTRACT

A method of forming self-aligned contact holes exposing source/drain regions in a semiconductor substrate using only etch mask layers is provided. In the method, sacrificial spacers are formed of a material having an excellent etching selectivity to the etch mask layers at sidewalls of gate electrodes in a cell area. Also, an interlevel dielectric layer is formed of a material having an excellent etching selectivity to the etch mask layers. The sacrificial spacers are removed when forming the self-aligned contact holes. Dielectric spacers are formed of a material having a low dielectric constant, without considering its etching selectivity to the interlevel dielectric layer. Thus, a reduction in the operational speed of a semiconductor device having transistors can be prevented.

21 Claims, 4 Drawing Sheets

SEMICONDUCTOR DEVICE HAVING TRANSISTOR AND METHOD OF MANUFACTURING THE SAME

RELATED APPLICATIONS

This application is a divisional of U.S. patent application Ser. No. 09/992,069 filed on Nov. 14, 2001 which application claims the benefit of Korean Patent Application No. 2001-28692, filed May 24, 2001, the disclosures of which are hereby incorporated herein by reference in their entirety as if set forth fully herein.

BACKGROUND OF THE INVENTION

1. Field of the Invention

The present invention relates to a semiconductor device and a method of manufacturing the same, and more particularly, to a semiconductor device having a transistor and a method of manufacturing the same.

2. Description of the Related Art

Transistors, which are elements determining the electrical characteristics of a semiconductor device, have gate electrodes formed on a semiconductor substrate and source and drain regions formed in the semiconductor substrate and aligned on both sides of the gate electrodes. In order to insulate the gate electrodes from the source and drain regions, the transistor adopts spacers which are formed of a dielectric material at the sidewalls of the gate electrodes. These dielectric spacers serve as an ion implantation mask classifying heavily doped source/drain regions and lightly doped source/drain regions in a transistor having a lightly doped drain (LDD) structure. The spacers are formed of silicon oxide or silicon nitride.

However, as the integration density of semiconductor devices increases and in particular, the length of gate electrodes becomes 0.18 µm or less, the size of contact holes for connecting bit lines to source/drain regions and connecting storage electrodes to source/drain regions decreases and a margin for forming the contact holes decreases. Thus, the spacers are formed at the sidewalls of the gate electrodes of a material having an excellent etching selectivity to an interlevel dielectric layer filled inbetween the gate electrodes, thereby proposing a technique of forming the contact holes by a self-aligned method (hereinafter, referred to as a method of forming self-aligned contact holes). In general, a silicon, oxide layer is used as an interlevel dielectric layer and a silicon nitride layer is used for dielectric spacers in the method of forming self-aligned contact holes.

A method of forming self-aligned contact holes according to the prior art will be described with reference to FIGS. 1A through 1C.

FIG. 1A is a plan view of a semiconductor device having a transistor where self-aligned contact holes are formed, and FIGS. 1B and 1C are cross-sectional views taken along lines I—I and II—II, respectively, of FIG. 1A.

Gate oxide layers (not shown), gate electrodes formed of polysilicon patterns 12 and tungsten or tungsten silicide patterns 14 and silicon nitride layer patterns 16 are sequentially formed on a semiconductor substrate 10. Spacers 18 are formed of silicon nitride at the sidewalls of the gate electrodes and the silicon nitride layer patterns 16. Etch stoppers 20 and 22 are formed of silicon nitride at the sidewalls of the spacers 18 or on the semiconductor substrate 10. Source and drain regions 30 are formed inbetween gate electrodes in the semiconductor substrate 10. A contact hole 26b for a plug that electrically connects bit lines (not shown) to the source/drain regions 30 and contact holes 26a and 26c for plugs that electrically connects storage electrodes to the source/drain regions 30 are self-aligned and formed by a method using spacers 18 formed of silicon nitride and having an excellent etching selectivity of an interlevel dielectric layer 24 filled inbetween gate electrodes. The etch stoppers 20 and 22 prevent the semiconductor substrate 10 from being damaged when removing the interlevel dielectric layer 24 between the gate electrodes. However, the etch stopper 22 remains on the semiconductor substrate 10 in FIG. 1C where the interlevel dielectric layer 24 is not removed.

The dielectric constant of silicon oxide is 4, and the dielectric constant of silicon nitride is 7. Since spacers formed at the sidewalls of gate electrodes contact source/drain regions, the resistance-capacitance (RC) of a transistor adopting spacers formed of silicon nitride is high, thereby decreasing the operational speed of semiconductor devices.

Currently, a method of forming self-aligned contact holes is applied only to a cell area but may be applied to a peripheral circuit area if the integration density is increased. Thus, a problem of decreasing the operation speed of a row decoder, a column decoder, and a sense amplifier formed in the peripheral circuit area may be expected.

As a result, an attempt to form spacers of SiC, which has a low dielectric constant, was made. However, in a case of using SiC spacers, a process of manufacturing transistors having SiC spacers can only be developed after fully grasping the operational characteristics of semiconductor devices including changes in operational characteristics of transistors due to SiC.

SUMMARY OF THE INVENTION

To solve the above-described problems, it is a first object of the present invention to provide a semiconductor device having a transistor which can inhibit an increase of RC and a method of manufacturing the same using an existing process of manufacturing the semiconductor device in which spacers are formed of silicon nitride.

It is a second object of the present invention to provide a semiconductor device having a transistor and a method of manufacturing the same to which a method of forming self-aligned contact holes can be applied.

According to an aspect of the present invention, to achieve the first and second objects of the present invention, there is provided a semiconductor device. The semiconductor device includes a portion having gate electrodes, etch mask layers, spacers formed of a material having a low dielectric constant at sidewalls of the gate electrodes and the etch mask layers, and transistors having source/drain regions formed in the semiconductor substrate and inbetween the gate electrodes; and another portion having conductive patterns and an interlevel dielectric layer formed of a material having an excellent etching selectivity to the etch mask layers to fill spaces inbetween the conductive patterns. The gate electrodes may be formed of polysilicon and tungsten or tungsten silicide formed on the polysilicon. The conductive patterns are formed of the same material as the gate electrodes, and a dielectric layer may be formed on the conductive patterns of the same material as the etch mask layers. Thus, the spacers at the sidewalls of the gate electrodes are formed of a material having a dielectric constant, e.g., silicon oxide, thereby inhibiting an increase in RC of the semiconductor device. The etch mask layers have an excellent etching selectivity to the interlevel dielectric layer. Thus, a semiconductor substrate on the source/drain regions, which will be filled with a conductive material to form a contact plug, may be exposed by a self-alignment method. For example, the interlevel dielectric layer may be a silicon oxide layer, and the etch mask layers may be silicon nitride layers. In order to prevent damage to the semiconductor substrate exposed in a process of forming self-aligned contact holes, the semiconductor device may include an etch stopper formed between the sidewalls of the gate electrodes and the etch mask layers and the spacers, on the surface and side of the interlevel dielectric layer, on sides of the conductive patterns, and between the interlevel dielectric layer and the semiconductor substrate. The etch stopper is formed of a material having an excellent etching selectivity to the interlevel dielectric layer, e.g., silicon nitride.

According to another aspect of the present invention, to achieve the first and second objects of the present invention, there is provided a semiconductor device. The semiconductor device includes: a semiconductor substrate having a cell area and a peripheral circuit area; gate electrodes and etch mask layers sequentially formed in the cell area and the peripheral circuit area in the semiconductor substrate, spacers formed of a material having a low dielectric constant at sidewalls of the gate electrodes and the etch mask layers and formed in at least one of the cell area and the peripheral circuit area; etch stoppers formed between the spacers and the sidewalls of the gate electrodes and the etch mask layers; a conductive layer filling spaces between the gate electrodes in the cell area; and an interlevel dielectric layer filling spaces between the gate electrodes in the peripheral circuit area and formed of a material having an excellent etching selectivity to the etch mask layers. The etch mask layers may be formed of silicon nitride. The spacers and the interlevel dielectric layer may be formed of silicon oxide.

The semiconductor device includes a first source/drain region having a first impurity concentration formed in the semiconductor substrate between the gate electrodes in the cell area and a second source/drain region having a first impurity region having a first impurity concentration formed in the semiconductor substrate between the gate electrodes in the peripheral circuit area and a second impurity region having a second impurity concentration denser than the first impurity concentration between the spacers formed at sidewalls of gate patterns in the peripheral circuit area.

To manufacture the semiconductor device, a semiconductor substrate having a cell area and a peripheral circuit area is prepared. Gate electrodes and etch mask layers are sequentially formed on the semiconductor substrate having the cell area and the peripheral circuit area. Sacrificial spacers are formed at sidewalls of the gate electrodes and the etch mask layers of a material having an excellent etching selectivity to the etch mask layers. The semiconductor substrate between the gate electrodes in the cell area and the peripheral circuit area is filled with an interlevel dielectric layer formed of a material having an etching selectivity of 1 to the sacrificial spacers and an excellent etching selectivity to the etch mask layers.

The etch mask layers may include silicon nitride layers. The interlevel dielectric layer may include a silicon oxide layer. The gate electrodes may include polysilicon layers and tungsten or tungsten silicide layers. The sacrificial spacers may include silicon oxide layers. The sacrificial spacers are formed by one of a low pressure chemical vapor deposition (LPCVD) method and an atomic layer deposition (ALD) method. The sacrificial spacers may have a thickness of 200–600 Å.

A first impurity region having a first impurity concentration is formed in the semiconductor substrate between the gate electrodes in the cell area and the peripheral circuit area using the gate electrodes and the etch mask layers as masks between the formation of the gate electrodes and the etch mask layers and the formation of the sacrificial spacers. A second impurity region having a second impurity concentration denser than the first impurity concentration is formed in the semiconductor substrate between the spacers in the peripheral circuit area using the spacers in the peripheral circuit area as masks between the formation of the sacrificial spacers and the filling of the semiconductor substrate between the gate electrodes in the cell area and the peripheral circuit area with an interlevel dielectric layer. As a result, source/drain regions having an LDD structure may formed in the peripheral circuit area.

The first impurity region in the cell area is exposed using the etch mask layers in the cell area after the filling of the semiconductor substrate between the gate electrodes in the cell area and the peripheral circuit area with an interlevel dielectric layer. Dielectric spacers are formed of a material having a low dielectric constant at sidewalls of the gate electrodes and sidewalls of the etch mask layers in the cell area, e.g., silicon oxide. Spaces between the gate electrodes and the etch mask layers in the cell area are filled with a conductive material.

An etch stopper is formed of a material having an excellent etching selectivity to the interlevel dielectric layer, e.g., a silicon nitride layer, on the surface of the gate electrodes and the etch mask layers and on the semiconductor substrate between the gate electrodes and the etch mask layers between the formation of the gate electrodes and the etch mask layers and the formation of the sacrificial spacers. The silicon nitride layer has a thickness of 50–200 Å, preferably, a thickness of 100 Å.

As described above, in the semiconductor device, self-aligned contact holes are formed using only the etch mask layers formed on the gate electrodes. Thus, the spacers may be formed at the sidewalls of the gate electrodes of a material having a low dielectric constant, e.g., silicon nitride without considering an etching selectivity to the interlevel dielectric layer filling the spaces between the gate electrodes in order to insulate the gate electrodes from the source/drain regions. Accordingly, an increase in RC of the semiconductor device can be inhibited and the self-aligned contact holes can be formed by an existing process.

BRIEF DESCRIPTION OF THE DRAWINGS

The above objects and advantages of the present invention will become more apparent by describing in detail a preferred embodiment thereof with reference to the attached drawings in which.

DETAILED DESCRIPTION OF THE INVENTION

Hereinafter, an embodiment of the present invention will be described in detail with reference to the attached drawings.

Figure 1A:
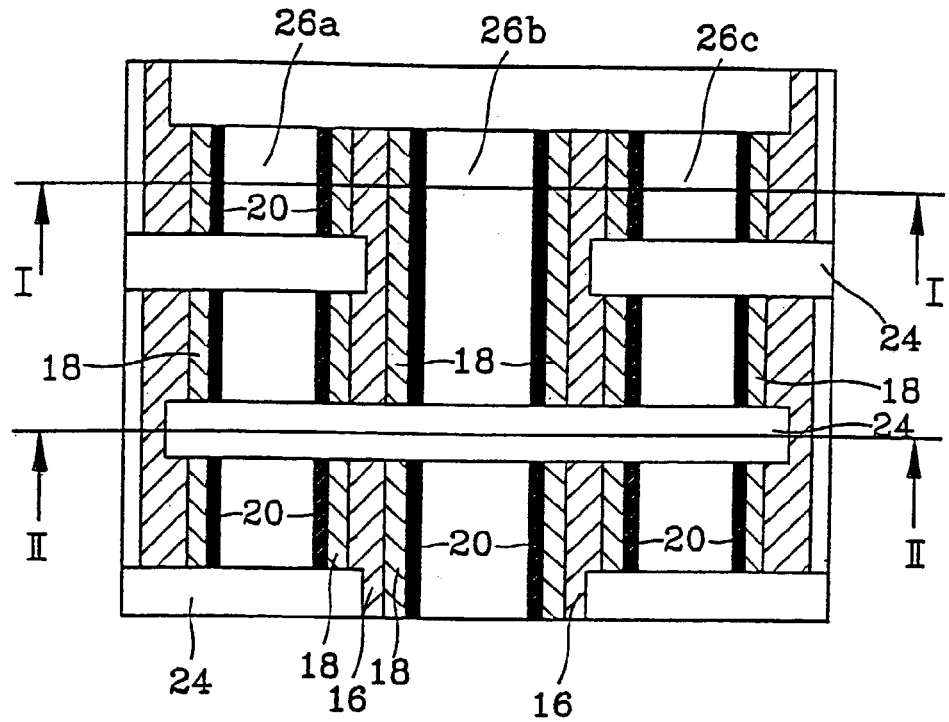
FIGS. 1A through 1C are a plan view and cross-sectional views of a semiconductor device having a transistor according to the prior art.
Figure 1B:
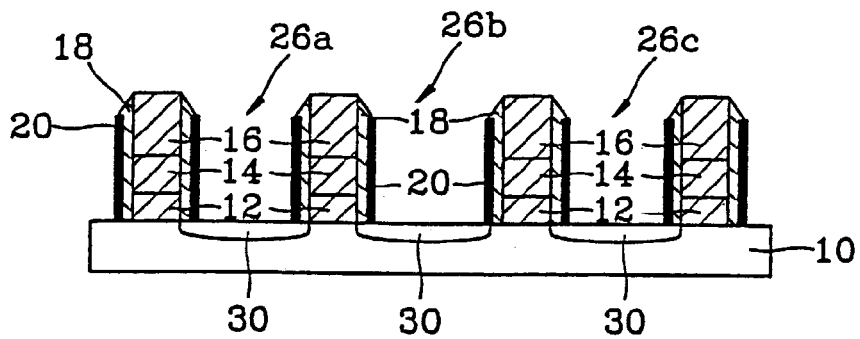
Figure 1C:
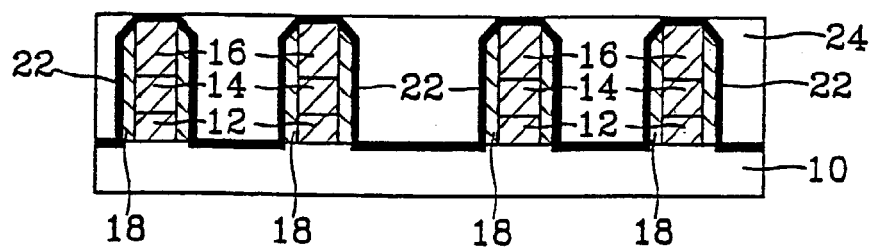
Figure 2A:
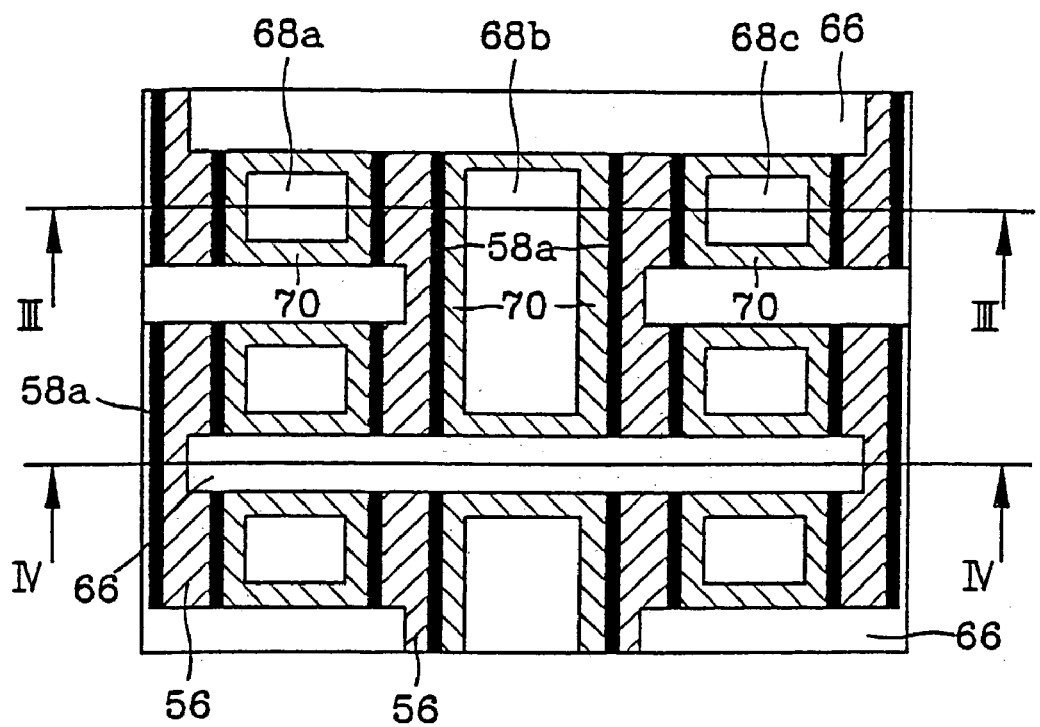
FIGS. 2A through 2C are a plan view and cross-sectional views of a semiconductor device having a transistor according to the present invention.
Figure 2B:
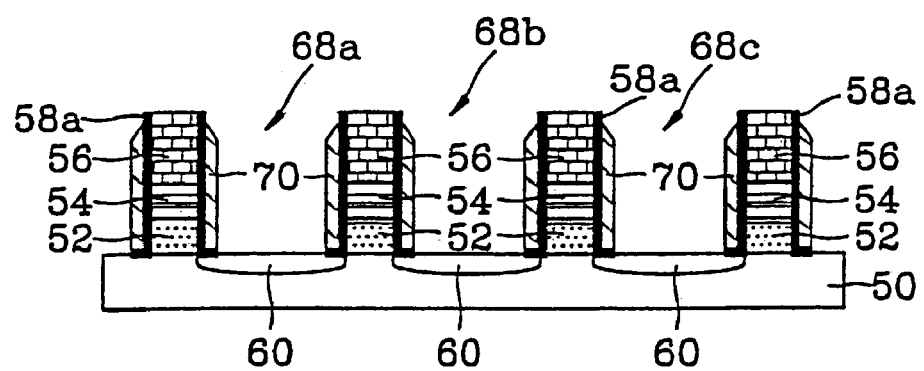
Figure 2C:
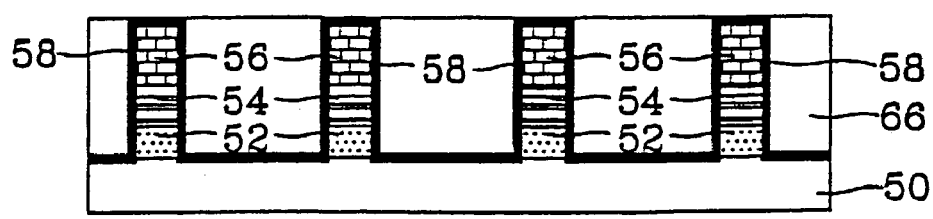

FIG. 2A is a plan view of a semiconductor device having a transistor where self-aligned contact holes are formed according to the present invention, and FIGS. 2B and 2C are cross-sectional views taken along lines III–III and IV–IV of FIG. 2A.

Gate oxide layers (not shown), gate electrodes formed of polysilicon patterns 52 and tungsten or tungsten silicide patterns 54, and silicon nitride layer patterns 56 are sequentially formed on a semiconductor substrate 50. Here, the silicon-nitride layer patterns 56 are etch mask layers serving as masks when forming self-aligned contact holes. Dielectric spacers 70 are formed of a material having a low dielectric constant at the sidewalls of the gate electrodes and the silicon nitride layer patterns 56. The material that has a low dielectric constant and is used to form the dielectric spacers may be silicon oxide. Reference numerals 68a and 68c denote storage electrode contact holes which are self-aligned using the silicon nitride layer patterns 56 as etch mask layers, and reference numeral 68b denotes a bit line contact hole which is also self-aligned using the etch mask layers. The storage contact holes 68a and 68c will be filled with plugs for connecting source/drain regions 60 (which will be described later) and storage electrodes (not shown), and the bit line contact hole 68b will be filled with a plug for connecting the source/drain regions 60 and bit lines (not shown).

In order to form storage electrode contact holes and bit line contact holes by a conventional self-aligned method, spacers are formed at the sidewalls of gate electrodes and of a material, such as silicon nitride, having an excellent etching selectivity to an interlevel dielectric layer 66. In the present invention, dielectric spacers 70 are formed at the sidewalls of gate electrodes after contact holes are itself aligned using etch mask layers formed on upper surfaces of the gate electrodes. Thus, the dielectric spacers 70 are formed of a material that reduces the RC of a semiconductor device, i.e., a material having a low dielectric constant and unaffected by a process of forming self-aligned contact holes in the present invention.

Etch stoppers 58a are formed between the sidewalls of the gate electrodes and the dielectric spacers 70. The etch stoppers 58a, which prevent a semiconductor substrate exposed due to a process of forming self-aligned contact holes from being damaged, are formed of a material having an excellent etching selectivity to the interlevel dielectric layer 66, such as silicon nitride. The etch stoppers 58a are also formed between the dielectric spacers 70 and the semiconductor substrate 50. The etch stoppers 58a remain on the semiconductor substrate 50 in an area where the storage electrode contact holes 68a and 68c and the bit line contact hole 68b are not formed, i.e., an area (FIG. 2C) where the interlevel dielectric layer 66 is not removed. Also, as described previously, the source/drain regions 60 are formed in the semiconductor substrate 50 inbetween the gate electrodes.

A method of manufacturing a semiconductor device having a transistor according to the present invention will be described in detail with reference to FIGS. 3A through 3F. Steps of manufacturing the semiconductor device in FIGS. 3A through 3F further include steps for forming the semiconductor device in a peripheral circuit area, which are shown in FIG. 2A.

Figure 3A:
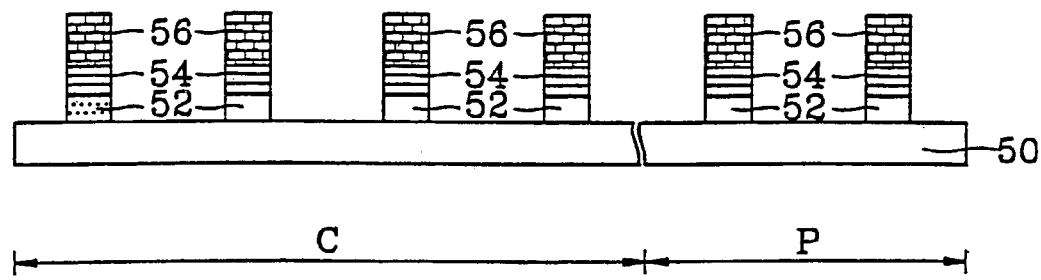
FIGS. 3A through 3F are cross-sectional views of steps of manufacturing a semiconductor device having a transistor according to an embodiment of the present invention.

Referring to FIG. 3A, a polysilicon layer, a tungsten or tungsten silicide layer, and a silicon nitride layer (three layers are all not shown) are sequentially formed on a semiconductor substrate 50 having a cell area C and a peripheral circuit area P and are then patterned, thereby forming gate electrodes formed of polysilicon patterns 52, and tungsten or tungsten silicide patterns 54, and silicon nitride layer patterns 56 acting as etch mask layers. Gate dielectric layers (not shown) are interposed between the gate electrodes and the semiconductor substrate 50. The etch mask layers 56 are formed of a material having an excellent etching selectivity to an interlevel dielectric layer (66 shown in FIG. 3D) which will be formed later, such as is silicon nitride. Here, the polysilicon patterns 52, the tungsten or tungsten silicide patterns 54, and the silicon nitride layer patterns 56 have thicknesses of 800 Å, 1000 Å, and 2400 Å, respectively.

Figure 3B:
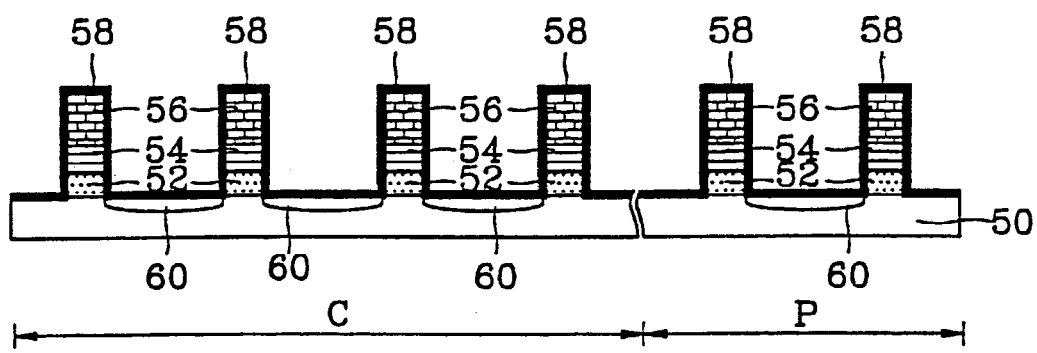

Referring to FIG. 3B, an etch stopper 58 is formed on the semiconductor substrate 50, on which the gate electrodes and the etch mask layers are formed, to a thickness of 50–200 Å using an atomic layer deposition (ALD) method or a low pressure chemical vapour deposition (LPCVD) method. The etch stopper 58, as described previously, protects portions of the semiconductor substrate 50 exposed during the formation of self-aligned contact holes from an etching process. Thus, it is preferable that the etch stopper 58 is formed of a material having an excellent etching selectivity to an interlevel dielectric layer (66 shown in FIG. 3D), for example, formed of silicon nitride, as in the present embodiment. Impurity regions are formed by performing a process of implanting ions using the gate electrodes and the etch mask layers as masks. The impurity regions are source/drain regions 60 of a transistor in a cell area and a source/drain regions of a transistor in a peripheral circuit area. The peripheral circuit area is further implanted with impurity ions that are denser than the impurity ions previously implanted.

Figure 3C:
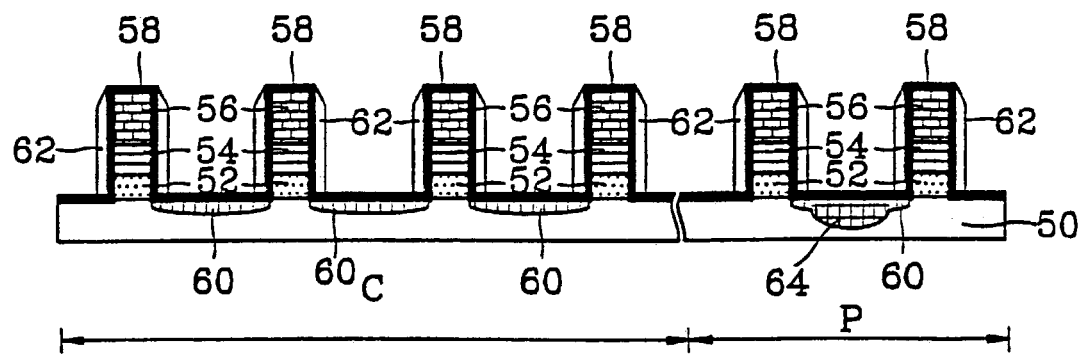

In other words, as shown in FIG. 3C, a dielectric material, such as a silicon oxide layer, is formed on the semiconductor substrate 50 having the cell area C and the peripheral circuit area P by ALD or LPCVD and is then etched back. As a result, sacrificial spacers 62 are formed to a thickness of 200–600 521 on the surface of the etch stopper 58 positioned at the sidewalls of the gate electrodes. The cell area C is covered with a predetermined mask (not shown), and the peripheral circuit area P is implanted with impurity ions denser than but having the same conductivity as the impurity ions of the impurity regions of the cell area C, i.e., the source/drain regions 60 to form an impurity region 64. Here, the impurity regions 60 and 64 have a different conductivity from the semiconductor substrate 50. The predetermined mask with which the cell area C is covered is removed and a thermal treatment is performed to activate the impurity regions. Thus, the source/drain regions 64 of the peripheral circuit area P is made up of lightly dense impurity ions and heavily dense impurity ions. The threshold voltage of a transistor in the cell area C is different from the threshold voltage of a transistor in the peripheral circuit area P due to the functional differences of the respective transistors. Thus, the concentration of impurity ions in the source/drain regions 60 of the transistor in the cell area C is different from the concentration of impurity ions in the source/drain region 64 of the transistor in the peripheral circuit area P. As a result, as shown in FIG. 3C, the structure of the source/drain regions 60 in the cell area C is different from the structure of the source/drain region 60 and 64 in the peripheral circuit area P.

However, transistors having a lightly doped drain (LDD) structure may be formed in both the cell area C and the peripheral circuit area P depending on the conditions of a particular process, the design rule, etc.

Figure 3D:
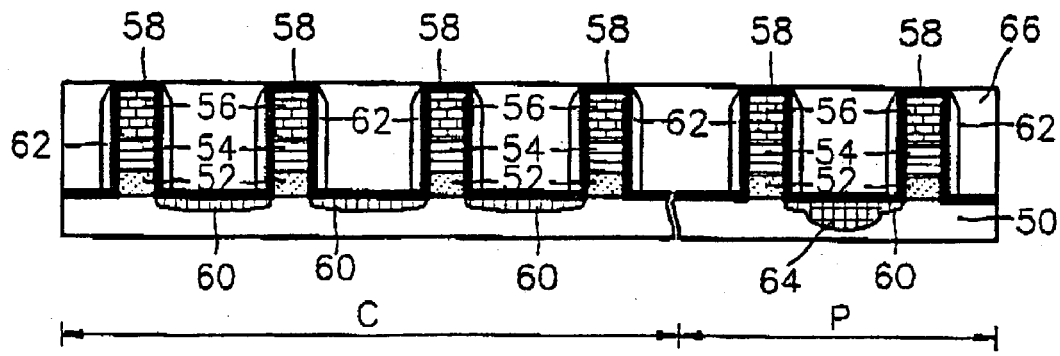

As shown in FIG. 3D, the semiconductor substrate 50 having the cell area C and the peripheral circuit area P is covered with a dielectric material having an etching selectivity of 1 to the sacrificial spacers 62 and an excellent etching selectivity to the etch mask layers and the etch stopper 58 to fill spaces inbetween the gate electrodes. Chemical mechanical polishing is performed until upper surface of the etch stopper 58 is exposed, thereby forming a planarized interlevel dielectric layer 66. A silicon oxide layer is used as the interlevel dielectric layer 66 in this embodiment.

Figure 3E:
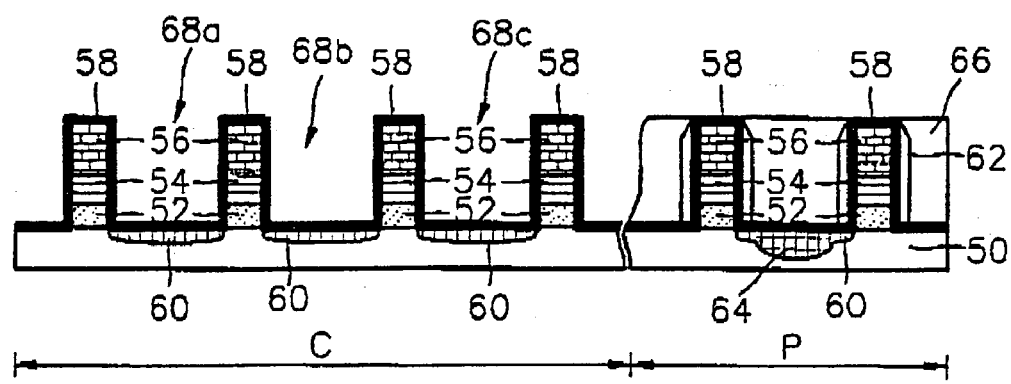

Referring to FIG. 3E, the interlevel dielectric layer 66 and the sacrificial spacers 62 in the cell area C are removed using a mask covering only the peripheral circuit area P to form contact holes 68a, 68b, and 68c that are self-aligned. Here, the etch mask layers and the etch stopper 58 are not removed in the process of etching the interlevel dielectric layer 66 and the sacrificial spacers 62. Thus, the gate electrodes, the etch mask layers, and the etch stopper 58 covering the top surfaces and sidewalls of the gate electrodes and the etch mask layers, and the semiconductor substrate 50 remain, and thus the self-aligned contact holes 68a, 68b, and 68c are formed.

Figure 3F:
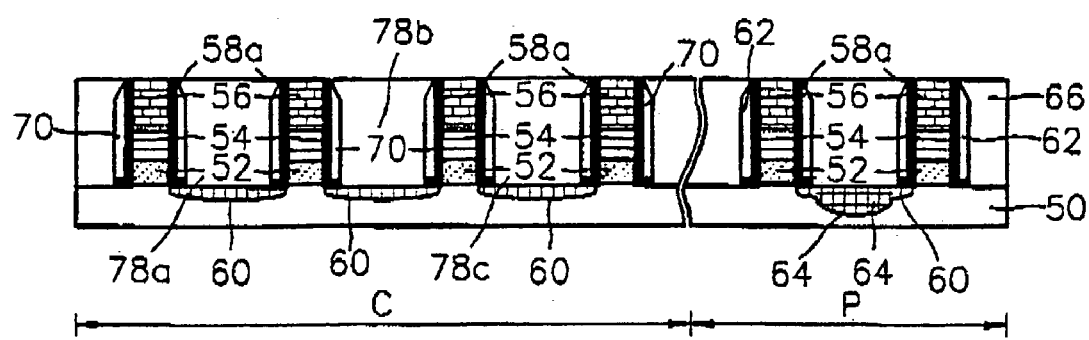

Referring to FIG. 3F, a dielectric material having a low dielectric constant is deposited over the semiconductor substrate 50 in the cell area C by LPCVD or ALD and is then etched back, thereby forming dielectric spacers 70 at the sidewalls of the gate electrodes in the cell area C. As described previously, since the sacrificial spacers 62 are removed while forming the contact holes 68a, 68b, and 68c, the dielectric spacers 70 are not used for forming the contact holes 68a, 68b, and 68c. Thus, the dielectric spacers 70 may be formed of a material having a low dielectric constant instead of silicon nitride which has a high dielectric constant. In this embodiment, the dielectric spacers 70 are formed of silicon oxide, which has a dielectric constant of 4, to a thickness of 200–600 Å.

The etch stopper 58 on the upper surface of the etch mask layers and the surface of the source/drain regions 60 is removed when forming the dielectric spacers 70 and remains only inbetween the dielectric spacers 70 and the sidewalls of the gate electrodes.

A conductive material, e.g., doped polysilicon, fills spaces between the dielectric spacers 70 in the cell area C and is then planarized, thereby forming plugs 78a, 78b, and 78c. Next, the mask covering only the peripheral circuit area P is removed. Bit lines, capacitors, metal lines, and passivation layers are formed to complete the semiconductor device.

According to the present invention, the sacrificial layers 62 formed at the sidewalls of the etch mask layers which are formed on the gate electrodes and at the sidewalls of the gate electrodes and the interlevel dielectric layer 66 between the gate electrodes are formed of a material having an excellent etching selectivity to the etch mask layers. Thus, the sacrificial spacers 62 are also removed when removing the interlevel dielectric layer 66 to form the contact holes 68a, 68b, and 68c. As a result, the contact holes 68a, 68b, and 68c exposing the semiconductor substrate 50 between the gate electrodes in the cell area C are self-aligned.

Forming the gate electrodes, the etch mask layers, the sacrificial spacers 62, and the interlevel dielectric layer 66 in the peripheral circuit area P as well as in the cell area C is advantageous to a process of manufacturing a semiconductor device. Thus, if self-aligned contact holes 68a, 68b, and 68c are to be easily formed in the peripheral circuit area P, the interlevel dielectric layer 66 and the sacrificial spacers 62 in the peripheral circuit area P as well as the cell, area C are removed.

The dielectric spacers 70 are formed at the sidewalls of the gate electrodes and the etch mask layers to insulate the gate electrodes from the source/drain regions 60 after removing the sacrificial spacers 62. Here, the dielectric spacers 70 may be formed of a material having a low dielectric constant, e.g. silicon oxide, without considering its etching selectivity to the interlevel dielectric layer 66. Thus, a reduction in the operational speed of a semiconductor device having transistors can be prevented.

Lightly dense source/drain regions are formed in the cell area C and the peripheral circuit area P, and then heavily dense source/drain region may be formed in the peripheral circuit area P using the sacrificial spacers 62. Silicon oxide is used as the material for the sacrificial spacers 62 and the dielectric spacers 70. Thus, there is an advantage in that the semiconductor device according to the present invention can be manufactured using the existing process without the burden of developing a new process.

What is claimed is:

1. A method of manufacturing a semiconductor device comprising:
   (a) preparing a semiconductor substrate having a cell area and a peripheral circuit area;
   (b) forming gate electrodes having gate electrode tops and etch mask layers on the semiconductor substrate having the cell area and the peripheral circuit area;
   (c) forming an etch stopper on the gate electrodes;
   (d) forming sacrificial spacers at sidewalls of the gate electrodes and the etch mask layers so that the etch stopper extends between the sacrificial spacers and the sidewalls of the gate electrodes and the etch mask layers from adjacent the semiconductor substrate to adjacent the gate electrode tops, wherein the etch stopper is formed of a first material, the sacrificial spacers are formed of a second material, and the first material is different than the second material;
   (e) filling the semiconductor substrate between the gate electrodes in the cell area and the peripheral circuit area with an interlevel dielectric layer
   (f) removing the interlevel dielectric layer and the sacrificial spacers from the cell area; and
   (g) forming cell area spacers at sidewalls of the gate electrodes and the etch mask layers in the cell area, wherein the cell area spacers are formed of a third material that is different than the second material of the sacrificial spacers.

2. The method of claim 1, wherein the etch mask layers comprises silicon nitride layers.

3. The method of claim 1, wherein the interlevel dielectric layer comprises a silicon oxide layer.

4. The method of claim 1, wherein the gate electrodes comprises polysilicon layers and tungsten or tungsten silicide layers.

5. The method of claim 1, wherein the second material of the sacrificial spacers comprises silicon oxide.

6. The method of claim 5, wherein the sacrificial spacers are formed by one of a low pressure chemical vapor deposition (LPCVD) method and an atomic layer deposition (ALD) method.

7. The method of claim 5, wherein the sacrificial spacers have a thickness of 200–600 Å.

8. The method of claim 1, further comprising forming a first impurity region having a first impurity concentration in the semiconductor substrate between the gate electrodes in the cell area and the peripheral circuit area using the gate electrodes and the etch mask layers as masks between steps (b) and (c) and forming a second impurity region having a second impurity concentration denser than the first impurity concentration in the semiconductor substrate between the sacrificial spacers in the peripheral circuit area using the sacrificial spacers in the peripheral circuit area as masks between steps (c) and (e).

9. The method of claim 8, wherein step (f) further comprises exposing the first impurity region in the cell area using the etch mask layers in the cell area.

10. The method of claim 9, wherein the cell area spacers are formed of a material having a low dielectric constant at sidewalls of the gate electrodes and sidewalls of the etch mask layers in the cell area.

11. The method of claim 10, wherein the cell area spacers are formed by one of LPCVD and ALD.

12. The method of claim 10, after forming the cell area spacers, further comprising filling spaces between the gate electrodes and the etch mask layers in the cell area with a conductive material.

13. The method of claim 1, wherein the first material of the etch stopper is silicon nitride.

14. The method of claim 13, wherein the etch stopper has a thickness of 50–200 Å.

15. A method of manufacturing a semiconductor device comprising:
    forming a portion having gate electrodes including gate electrode tops, etch mask layers, sacrificial spacers formed of a material having a low dielectric constant at sidewalls of the gate electrodes and the etch mask layers, and transistors having source/drain regions formed in the semiconductor substrate and inbetween the gate electrodes;
    forming another portion having conductive patterns and an interlevel dielectric layer formed between the conductive patterns; and
    forming an etch stopper extending between the sacrificial spacers and the sidewalls of the gate electrodes and the etch mask layers from adjacent the semiconductor substrate to adjacent the gate electrode tops, wherein the etch stopper is formed of a first material, the sacrificial spacers are formed of a second material, and the first material is different than the second material;
    wherein the sacrificial spacers are formed in first and second regions of the semiconductor substrate;
    removing the interlevel dielectric layer and the sacrificial spacers from the first region; and
    forming other spacers at sidewalls of the gate electrodes and the etch mask layers in the first region, wherein the other spacers are formed of a third material that is different than the second material of the sacrificial spacers.

16. The method of claim 15, wherein the first material of the etch stopper is silicon nitride layer, and the second material of the sacrificial spacers is silicon oxide.

17. A method of manufacturing a semiconductor device comprising:
    forming a semiconductor substrate having a cell area and a peripheral circuit area;
    forming gate electrodes including gate electrode tops and etch mask layers sequentially formed in the cell area and the peripheral circuit area in the semiconductor substrate;
    forming sacrificial spacers formed of a material having a low dielectric constant at sidewalls of the gate electrodes and the etch mask layers in the cell area and the peripheral circuit area;
    forming etch stoppers extending between the sacrificial spacers and the sidewalls of the gate electrodes and the etch mask layers from adjacent the semiconductor substrate to adjacent the gate electrode tops;
    forming a conductive layer filling spaces between the gate electrodes in the cell area; and
    forming an interlevel dielectric layer filling spaces between the gate electrodes in the peripheral circuit area, wherein the etch stopper is formed of a first material, the sacrificial spacers are formed of a second material, and the first material is different than the second material;
    removing the interlevel dielectric layer and the sacrificial spacers from the cell area; and
    forming cell area spacers at sidewalls of the gate electrodes and the etch mask layers in the cell area, wherein the cell area spacers are formed of a third material that is different than the second material of the sacrificial spacers.

18. The method of claim 17, wherein the first material of the etch stopper is silicon nitride, and the second material of the sacrificial spacers is silicon oxide.

19. A method of manufacturing a semiconductor device comprising:
    forming a semiconductor substrate;
    forming gate electrodes on the semiconductor substrate including gate electrode tops;
    forming spacers on a sidewall of at least one of the gate electrodes;
    forming an etch stopper extending between the spacers and the sidewalls of the gate electrodes from adjacent the semiconductor substrate to adjacent the gate electrode tops, wherein the etch stopper is formed of a first material, the spacers are formed of a second material, and the first material is different than the second material;
    wherein the step of forming a spacer on a sidewall of at least one of the gate electrodes comprises:
    forming first spacers on a sidewall of at least one of the gate electrodes in a first region and a second region of the semiconductor substrate;
    removing the first spacers in the second region of the semiconductor substrate; and
    forming second spacers in the second region of the semiconductor substrate, the first spacers in the first region having a dielectric constant that is different from a dielectric constant of the second spacers in the second region.

20. The method of claim 19, further comprising:
    forming first and second regions of the semiconductor substrate, wherein the gate electrodes are on the first and second regions;
    forming a conductive layer between the gate electrodes in the first region; and
    forming an interlevel dielectric layer between the gate electrodes in the second region.

21. The method of claim 19, wherein the first material of the etch stopper is silicon nitride, and the second material of the first spacers is silicon oxide.

* * * * *